United States Patent
Yeknami et al.

(10) Patent No.: US 11,719,738 B2
(45) Date of Patent: *Aug. 8, 2023

(54) TWO-DOMAIN TWO-STAGE SENSING FRONT-END CIRCUITS AND SYSTEMS

(71) Applicant: Samsung Display Co., Ltd., Yongin-si (KR)

(72) Inventors: Ali Fazli Yeknami, San Jose, CA (US); Younghoon Song, Santa Clara, CA (US)

(73) Assignee: Samsung Display Co., Ltd., Yongin-si (KR)

( * ) Notice: Subject to any disclaimer, the term of this patent is extended or adjusted under 35 U.S.C. 154(b) by 37 days.

This patent is subject to a terminal disclaimer.

(21) Appl. No.: 17/168,093

(22) Filed: Feb. 4, 2021

(65) Prior Publication Data

US 2022/0120805 A1  Apr. 21, 2022

Related U.S. Application Data

(60) Provisional application No. 63/092,125, filed on Oct. 15, 2020.

(51) Int. Cl.
*G01R 31/26* (2020.01)
*H03F 3/45* (2006.01)

(52) U.S. Cl.
CPC ..... *G01R 31/2601* (2013.01); *G01R 31/2607* (2013.01); *H03F 3/45475* (2013.01);
(Continued)

(58) Field of Classification Search
CPC .............. G01R 31/2601; G01R 31/2607; G01R 17/02; H03F 2200/129; H03F 2200/165; H03F 2200/81; H03F 2203/45051; H03F 2203/45134; H03F 2203/45138; H03F 2203/45174; H03F 2203/45512;
(Continued)

(56) References Cited

U.S. PATENT DOCUMENTS 5,239,210 A  8/1993  Scott
6,753,913 B1  6/2004  Bilhan et al.
(Continued)

FOREIGN PATENT DOCUMENTS

EP  0 986 900 B1  8/2005
EP  2 738 757 A1  6/2014
(Continued)

OTHER PUBLICATIONS

U.S. Appl. No. 16/656,423, filed Oct. 17, 2019.
(Continued)

*Primary Examiner* — Vinh P Nguyen
(74) *Attorney, Agent, or Firm* — Lewis Roca Rothgerber Christie LLP

(57) ABSTRACT

A circuital system that includes a differential low-pass filter having a differential output and operable in a first voltage domain. Some embodiments include a differential integrator including a differential input and a differential output, and operable in a second voltage domain different from the first voltage domain. Some embodiments include a pair of AC coupling capacitors coupling the differential output of the differential low-pass filter to the differential input of the differential integrator.

20 Claims, 9 Drawing Sheets

(52) U.S. Cl.
CPC .. *H03F 2200/129* (2013.01); *H03F 2200/165* (2013.01); *H03F 2203/45512* (2013.01)

(58) Field of Classification Search
CPC . H03F 2203/45534; H03F 2203/45562; H03F 2203/45652; H03F 3/45475; H03F 3/45977; H03F 2203/45514; H03F 3/005; G09G 3/3233; G09G 2310/0297; G09G 2310/066; G09G 2320/0295; G09G 2320/043; G09G 2320/0693; G09G 3/32; G09G 3/3275; G09G 3/3291; G09G 2310/027; G09G 2320/045; G09G 3/006; G09G 3/3208; H03M 1/66

See application file for complete search history.

(56) References Cited

U.S. PATENT DOCUMENTS

| | | | |
|---|---|---|---|
| 6,822,679 B1 * | 11/2004 | Kulhalli | H04N 5/367 348/311 |
| 6,909,391 B2 * | 6/2005 | Rossi | H03F 3/005 341/172 |
| 6,919,551 B2 | 7/2005 | Barna et al. | |
| 7,245,321 B2 | 7/2007 | Panicacci et al. | |
| 7,564,397 B2 * | 7/2009 | Cho | H03F 1/342 341/161 |
| 7,764,118 B2 | 7/2010 | Kusuda et al. | |
| 7,786,911 B2 | 8/2010 | Joshi et al. | |
| 8,497,731 B1 | 7/2013 | Beckwith et al. | |
| 8,659,325 B2 | 2/2014 | Nishi | |
| 8,984,463 B2 | 3/2015 | Xie et al. | |
| 9,191,598 B2 | 11/2015 | Blanquart et al. | |
| 9,721,504 B2 | 8/2017 | Kim et al. | |
| 9,722,582 B2 | 8/2017 | Jung | |
| 10,187,026 B2 * | 1/2019 | Zamprogno | H03G 3/30 |
| 10,714,051 B1 | 7/2020 | Huang et al. | |
| 10,762,836 B1 | 9/2020 | Bae et al. | |
| 10,897,592 B1 * | 1/2021 | Giduturi | H03G 3/30 |
| 11,069,282 B2 * | 7/2021 | Amirkhany | G09G 3/32 |
| 11,081,064 B1 * | 8/2021 | Amirkhany | G09G 3/3291 |
| 2005/0243193 A1 | 11/2005 | Gove et al. | |
| 2005/0248671 A1 | 11/2005 | Schweng | |
| 2006/0139097 A1 | 6/2006 | Mukherjee et al. | |
| 2006/0238477 A1 | 10/2006 | Lew et al. | |
| 2007/0030262 A1 | 2/2007 | Ambo et al. | |
| 2007/0080908 A1 | 4/2007 | Nathan et al. | |
| 2009/0058324 A1 | 3/2009 | Nakao | |
| 2009/0237121 A1 | 9/2009 | Surendranath et al. | |
| 2009/0295422 A1 | 12/2009 | Hamer et al. | |
| 2010/0271517 A1 | 10/2010 | De Wit et al. | |
| 2013/0082936 A1 | 4/2013 | Islamkulov et al. | |
| 2013/0099692 A1 | 4/2013 | Chaji et al. | |
| 2013/0100173 A1 | 4/2013 | Chaji et al. | |
| 2013/0141368 A1 | 6/2013 | Wang et al. | |
| 2014/0152642 A1 | 6/2014 | Kim et al. | |
| 2014/0198092 A1 | 7/2014 | Azizi et al. | |
| 2015/0009204 A1 | 1/2015 | Chaji | |
| 2015/0195569 A1 | 7/2015 | Jung et al. | |
| 2015/0213757 A1 | 7/2015 | Takahama et al. | |
| 2015/0243221 A1 | 8/2015 | Lim | |
| 2015/0261341 A1 | 9/2015 | Weinerth et al. | |
| 2016/0005358 A1 | 1/2016 | Wang | |
| 2016/0012765 A1 | 1/2016 | Jeong | |
| 2016/0055791 A1 | 2/2016 | Kishi et al. | |
| 2016/0086539 A1 | 3/2016 | Mizukoshi | |
| 2016/0202061 A1 | 7/2016 | Maurer et al. | |
| 2016/0261817 A1 | 9/2016 | Totsuka et al. | |
| 2016/0267844 A1 | 9/2016 | Senda et al. | |
| 2016/0372044 A1 | 12/2016 | Kwon et al. | |
| 2017/0003779 A1 | 1/2017 | Reynolds et al. | |
| 2017/0039939 A1 | 2/2017 | Chaji | |
| 2017/0039953 A1 | 2/2017 | Lee | |
| 2017/0090669 A1 | 3/2017 | Paladugu et al. | |
| 2017/0093421 A1 | 3/2017 | Bell et al. | |
| 2017/0154573 A1 | 6/2017 | Woo et al. | |
| 2018/0090042 A1 | 3/2018 | Lin et al. | |
| 2018/0100943 A1 | 4/2018 | Sternberg | |
| 2018/0114815 A1 | 4/2018 | Lee et al. | |
| 2018/0166515 A1 | 6/2018 | An et al. | |
| 2018/0182303 A1 | 6/2018 | Jung et al. | |
| 2018/0336816 A1 | 11/2018 | Shin et al. | |
| 2019/0035351 A1 | 1/2019 | Pyun et al. | |
| 2019/0088205 A1 | 3/2019 | Zhang et al. | |
| 2019/0221146 A1 | 7/2019 | Lin et al. | |
| 2019/0247664 A1 | 8/2019 | Irazoqui et al. | |
| 2019/0336757 A1 | 11/2019 | Rodriguez et al. | |
| 2020/0059240 A1 | 2/2020 | Moue | |
| 2020/0083901 A1 | 3/2020 | Adusumalli et al. | |
| 2020/0091884 A1 | 3/2020 | Venkatraman et al. | |
| 2020/0184888 A1 | 6/2020 | Brownlow et al. | |
| 2020/0202787 A1 | 6/2020 | Do et al. | |

FOREIGN PATENT DOCUMENTS

| | | |
|---|---|---|
| EP | 3 343 556 A1 | 7/2018 |
| KR | 10-2008-0107064 A | 12/2008 |
| KR | 10-2013-0053458 A | 5/2013 |

OTHER PUBLICATIONS

U.S. Appl. No. 16/656,447, filed Oct. 17, 2019.
U.S. Appl. No. 16/657,680, filed Oct. 18, 2019.
EPO Extended European Search Report for European Patent Application No. 20156633.8, dated Apr. 16, 2020, 9 pages.
U.S. Office Action dated Aug. 7, 2020, issued in U.S. Appl. No. 16/656,447 (26 pages).
U.S. Notice of Allowance dated Sep. 9, 2020, issued in U.S. Appl. No. 16/657,680 (8 pages).
Chen, Hsin-Liang, et al.; A Low-Offset Low-Noise Sigma-Delta Modulator With Pseudorandom Chopper-Stabilization Technique, IEEE Transactions on Circuits and Systems—I: Regular Papers, vol. 56, No. 12, Dec. 2009, 11 pages.
Extended European Search Report for corresponding European Patent Application No. 20179974.9, dated Aug. 20, 2020, 12 pages.
Extended European Search Report for corresponding European Patent Application No. 20176949.4, dated Aug. 27, 2020, 13 pages.
U.S. Office Action dated Nov. 5, 2020, issued in U.S. Appl. No. 16/848,706 (22 pages).
U.S. Notice of Allowance dated Dec. 11, 2020, issued in U.S. Appl. No. 16/656,447 (10 pages).
U.S. Office Action dated Jan. 28, 2021, issued in U.S. Appl. No. 16/869,546 (10 pages).
U.S. Notice of Allowance dated Jun. 1, 2021, issued in U.S. Appl. No. 16/656,423 (13 pages).

* cited by examiner

FIG. 7

|  | HV DESIGN | | HV-LV DESIGN | |
| --- | --- | --- | --- | --- |
|  | CURRENT(μA) | AREA(μM²) | CURRENT(μA) | AREA(μM²) |
| 1ST. STAGE | 26 | 330X50 | 11 | 170X50ᵃ |
| 2ND. STAGE | 26 | 330X50 | 9 | 40X50 |
| COMPARATOR | 0.8 | 276X50 | 1.3 | 106X50 |

TWO-DOMAIN TWO-STAGE SENSING FRONT-END CIRCUITS AND SYSTEMS

CROSS-REFERENCE TO RELATED APPLICATION(S)

The present application claims priority to and the benefit of U.S. Provisional Application No. 63/092,125, filed Oct. 15, 2020, entitled "TWO-STAGE SENSING FRONT-END WITH LOW-VOLTAGE 2ND-STAGE INTEGRATOR AND ONE-BIT COMPARATOR", which is incorporated herein by reference in its entirety.

FIELD

The present disclosure relates to a two-domain two-stage sensing front-end circuits and systems. More particularly, it relates to a two-stage sensing front-end circuit with a low voltage second stage integrator.

BACKGROUND

A video display such as those used for computers or mobile devices may have a plurality of pixels, and, in each pixel, a plurality of transistors, including a drive transistor configured to control a drive current through a display element such as a light emitting diode (LED) (e.g., an organic light emitting diode (OLED)). Variations between the characteristics of the drive transistors of the display, or changes with time of the characteristics of any one of the drive transistors may, if not compensated for, degrade the quality of images or video displayed by the display. To compensate for such variation, or changes, it may be advantageous to measure the characteristics of the drive transistors. Thus, there is a need for a system and method for measuring characteristics of drive transistors in a display.

SUMMARY

According to a first aspect, a circuital system includes: a differential low-pass filter including a differential output and operable in a first voltage domain; a differential integrator comprising a differential input and a differential output, and operable in a second voltage domain different from the first voltage domain; and a pair of AC coupling capacitors coupling the differential output of the differential low-pass filter to the differential input of the differential integrator.

The pair of AC coupling capacitors may be configured to electrically isolate the first voltage domain from the second voltage domain.

The first voltage domain may be supplied by a first voltage from an external power supply and the second voltage domain may be supplied by a second voltage from the external power supply.

The second voltage may be a lower voltage than the first voltage.

The system may further include a polarity-reversing switch coupled between the pair of AC coupling capacitors and the differential input of the differential integrator, wherein the polarity-reversing switch is configured to receive a polarity-reversing control signal operable in the second voltage domain.

The polarity-reversing switch may be configured to reverse a polarity of the differential input to the differential integrator responsive to receiving the polarity-reversing control signal.

The polarity-reversing switch may be a correlated double sampling (CDS) circuit including: a pair of first switches configured to couple a first electrode of the differential low-pass filter output to a first electrode of the differential integrator input, and couple a second electrode of the differential low-pass filter output to a second electrode of the differential integrator input, responsive to a first polarity-reversing control signal; and a pair of second switches configured to couple the first electrode of the differential low-pass filter output to the second electrode of the differential integrator input, and couple the second electrode of the differential low-pass filter output to the first electrode of the differential integrator input, responsive to a second polarity-reversing control signal.

The differential integrator may further include a pair of integrator reset switches configured to reset the differential integrator responsive to an integrator reset control signal, wherein the pair of integrator reset switches are operable in the second voltage domain.

The differential low-pass filter may further include a pair of filter reset switches configured to reset the differential low-pass filter responsive to receiving a filter reset control signal, wherein the pair of filter reset switches are operable in the first voltage domain.

The system may further include a comparator that includes a differential input coupled to the differential output of the differential integrator, and operable in the second voltage domain.

The comparator may be coupled to receive a clock signal, wherein the clock signal is operable in the second voltage domain.

According to another aspect, a sensing circuit may include: a low-pass filtering stage operable in a first voltage domain, the low-pass filtering stage including: a first differential amplifier comprising a differential input and a differential output; a first feedback capacitor coupling a first output electrode of the differential output of the first differential amplifier to a first input electrode of the differential input of the first differential amplifier; and a second feedback capacitor coupling a second output electrode of the differential output of the first differential amplifier to a second input electrode of the differential input of the first differential amplifier; an integrator stage operable in a second voltage domain, the integrator stage including: a second differential amplifier including a differential input and a differential output; a third feedback capacitor coupling a first output electrode of the differential output of the of the second differential amplifier to a first input electrode of the differential input of the second differential amplifier; and a fourth feedback capacitor coupling a second output electrode of the differential output of the second differential amplifier to a second input electrode of the differential input of the second differential amplifier; and a pair of AC-coupling capacitors coupling the differential output of the first differential amplifier to the differential input of the second differential amplifier, and configured to electrically isolate the first voltage domain from the second voltage domain.

The first voltage domain may be supplied by a first voltage from an external power supply and the second voltage domain may be supplied by a second voltage from the external power supply, and wherein the second voltage is a lower voltage than the first voltage.

The integrator stage further includes a polarity-reversing switch coupled between the pair of AC-coupling capacitors and the differential input of the second differential amplifier, wherein the polarity-reversing switch is configured to receive a polarity-reversing control signal operable in the second voltage domain.

The polarity-reversing switch may be a correlated double sampling (CDS) circuit, and the CDS may be configured to reverse a polarity of the differential input to the second differential amplifier responsive to receiving the polarity-reversing control signal.

The integrator stage may further include: a first integrator reset switch connected across the third feedback capacitor; a second integrator reset switch connected across the fourth feedback capacitor; and wherein the first integrator reset switch and the second integrator reset switch are operable in the second voltage domain and configured to reset a respective differential output of the second differential amplifier responsive to receiving a respective integrator reset control signal.

The low-pass filtering stage may further include: a first filter reset switch connected across the first feedback capacitor; a second filter reset switch connected across the second feedback capacitor; and wherein the first filter reset switch and the second filter reset switch are operable in the first voltage domain and configured to reset a respective differential output of the first differential amplifier responsive to receiving a respective filter reset control signal.

The circuit may further include a comparator that includes a differential input coupled to the differential output of the second differential amplifier, and operable in the second voltage domain.

The comparator may be coupled to receive a clock signal operable in the second voltage domain.

The second differential amplifier may be a fully differential amplifier.

The scope of the invention is defined by the claims, which are incorporated into this section by reference. A more complete understanding of embodiments of the invention will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE DRAWINGS

FIG. 7 is a chart comparing characteristics of different types of two-stage sensing front-end circuits, according to an embodiment of the present disclosure.

Figure 1:
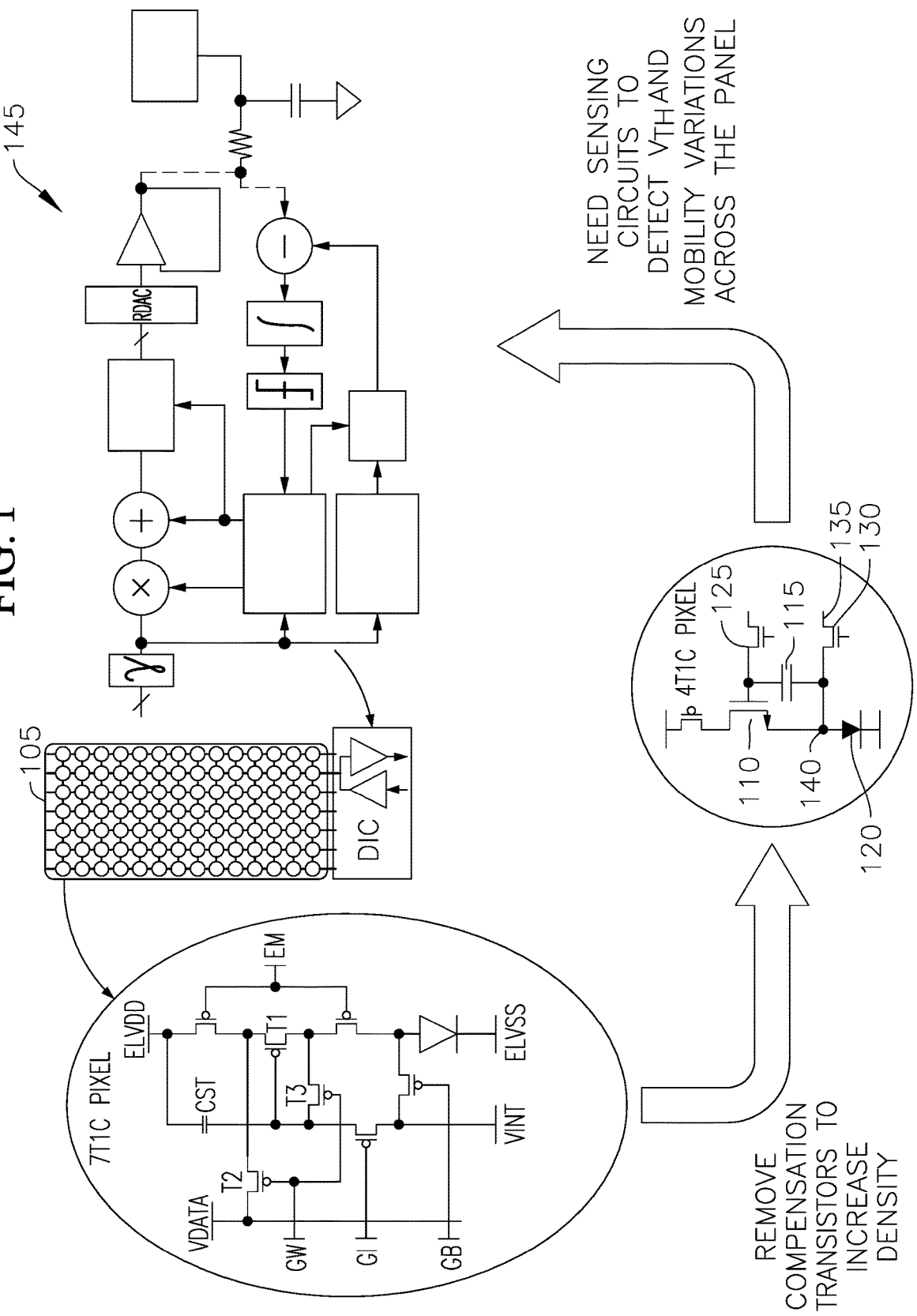
FIG. 1 is a context diagram, according to an embodiment of the present disclosure.

Embodiments of the present disclosure and their advantages are best understood by referring to the detailed description that follows. Unless otherwise noted, like reference numerals denote like elements throughout the attached drawings and the written description, and thus, descriptions thereof will not be repeated. In the drawings, the relative sizes of elements, layers, and regions may be exaggerated for clarity.

DETAILED DESCRIPTION

The detailed description set forth below in connection with the appended drawings is intended as a description of exemplary embodiments of a correlated double sampling pixel sensing front-end provided in accordance with the present disclosure and is not intended to represent the only forms in which the present disclosure may be constructed or utilized. The description sets forth the features of the present disclosure in connection with the illustrated embodiments. It is to be understood, however, that the same or equivalent functions and structures may be accomplished by different embodiments that are also intended to be encompassed within the scope of the disclosure. As denoted elsewhere herein, like element numbers are intended to indicate like elements or features.

Referring to FIG. 1, in some embodiments a display (e.g., a mobile device display) 105 may include a plurality of pixels arranged in rows and columns. Each pixel may be configured to produce light of one color (e.g., red, green or blue) and may be part of a composite pixel that includes, e.g., three such pixels and that is configured to produce any of a wide range of colors (in some contexts, what is referred to herein as a "pixel" is instead referred to as a "sub-pixel", and what is referred to herein as a "composite pixel" is instead referred to as a "pixel"). Each pixel may include a drive circuit, e.g., 7-transistor 1-capacitor (7T1C) drive circuit as shown on the left of FIG. 1 or a 4-transistor 1-capacitor (4T1C) drive circuit as shown at the bottom of FIG. 1. In the 4T1C drive circuit, a drive transistor 110 (the gate-source voltage of which is controlled by the capacitor 115) controls the current through the light emitting diode 120 when the pixel is emitting light. An upper pass-gate transistor 125 may be used to selectively connect the gate of the drive transistor 110 (and one terminal of the capacitor 115) to a power supply voltage, and a lower pass-gate transistor 130 may be used to selectively connect a drive sense conductor 135 to a source node 140 (which is a node connected to the source of the drive transistor 110, to the anode of the light emitting diode 120 and to the other terminal of the capacitor 115).

A pixel drive and sense circuit 145 (discussed in further detail below) may be connected to the drive sense conductor 135. The pixel drive and sense circuit 145 may include a drive amplifier and a sensing circuit, configured to be selectively connected, one at a time, to the drive sense conductor 135. When current flows through the drive transistor 110, and the lower pass-gate transistor 130 is turned off, disconnecting the drive sense conductor 135 from the source node 140, current may flow through the light emitting diode 120, causing it to emit light. When the lower pass-gate transistor 130 is turned on and the drive sense conductor 135 is driven to a lower voltage than the cathode of the light emitting diode 120, the light emitting diode 120 may be reverse-biased and any current flowing in the drive sense conductor 135 may flow to the pixel drive and sense circuit 145, where it may be sensed. This sensed current may be compared to a desired current (e.g., the current that an ideal, or nominal transistor would drive at the same gate-source voltage), and to the extent that the sensed current differs from the ideal current, measures may be taken (e.g., the gate-source voltage may be adjusted) to compensate for the discrepancy.

Figure 2A:
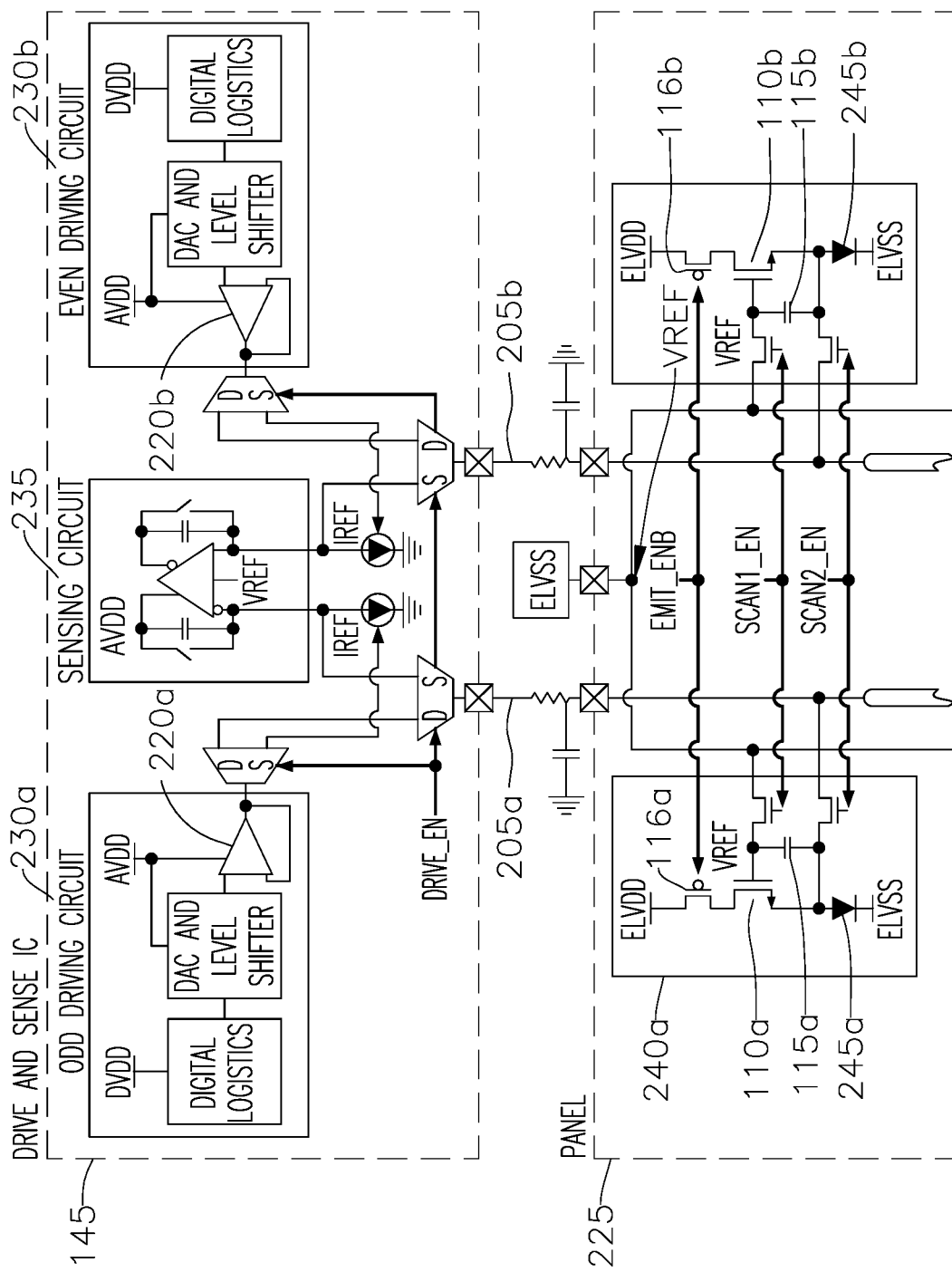
FIGS. 2A-2C are schematic diagrams of a display panel and a drive and sense integrated circuit, according to an embodiment of the present disclosure.
Figure 2B:
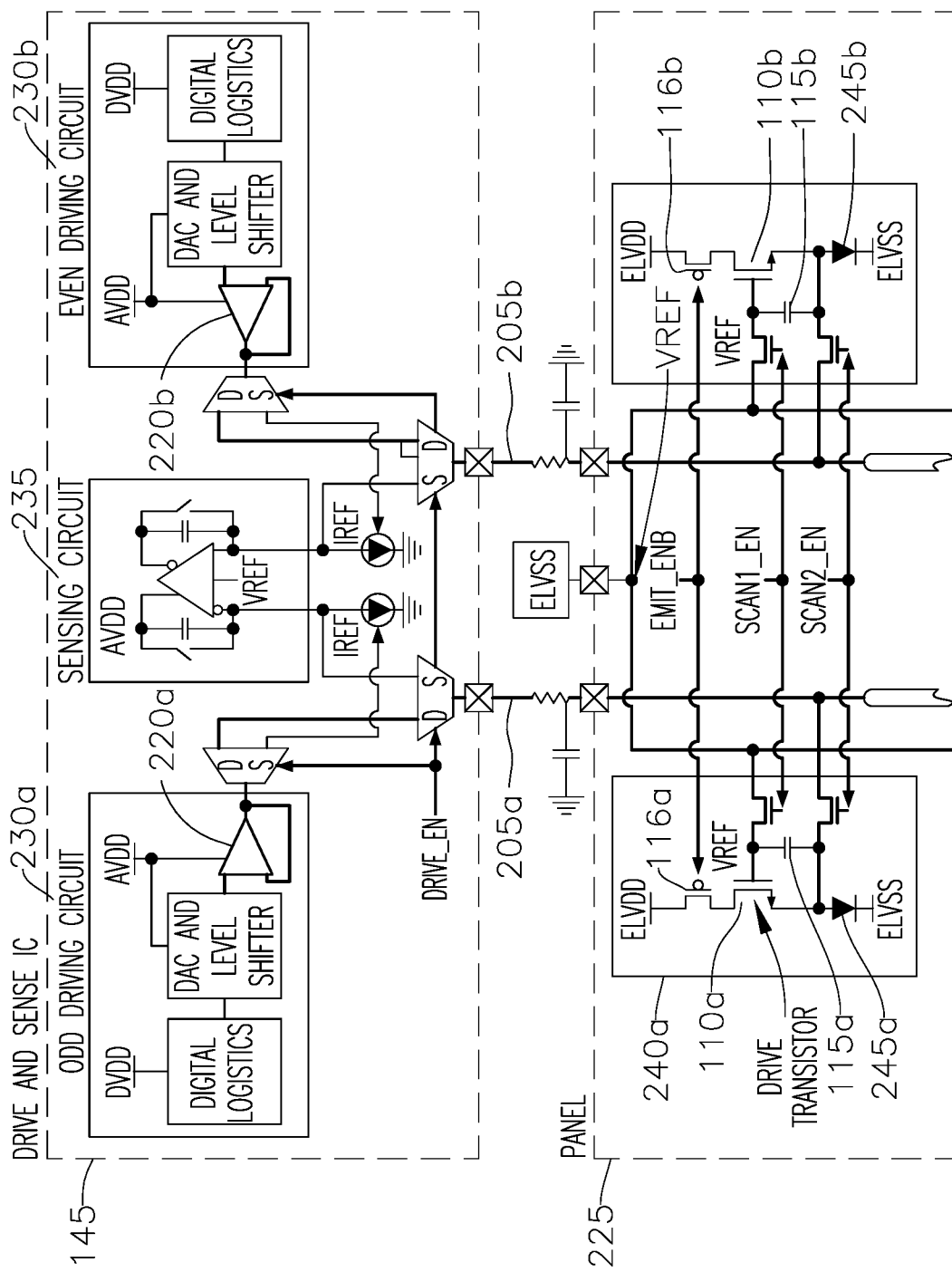
Figure 2C:
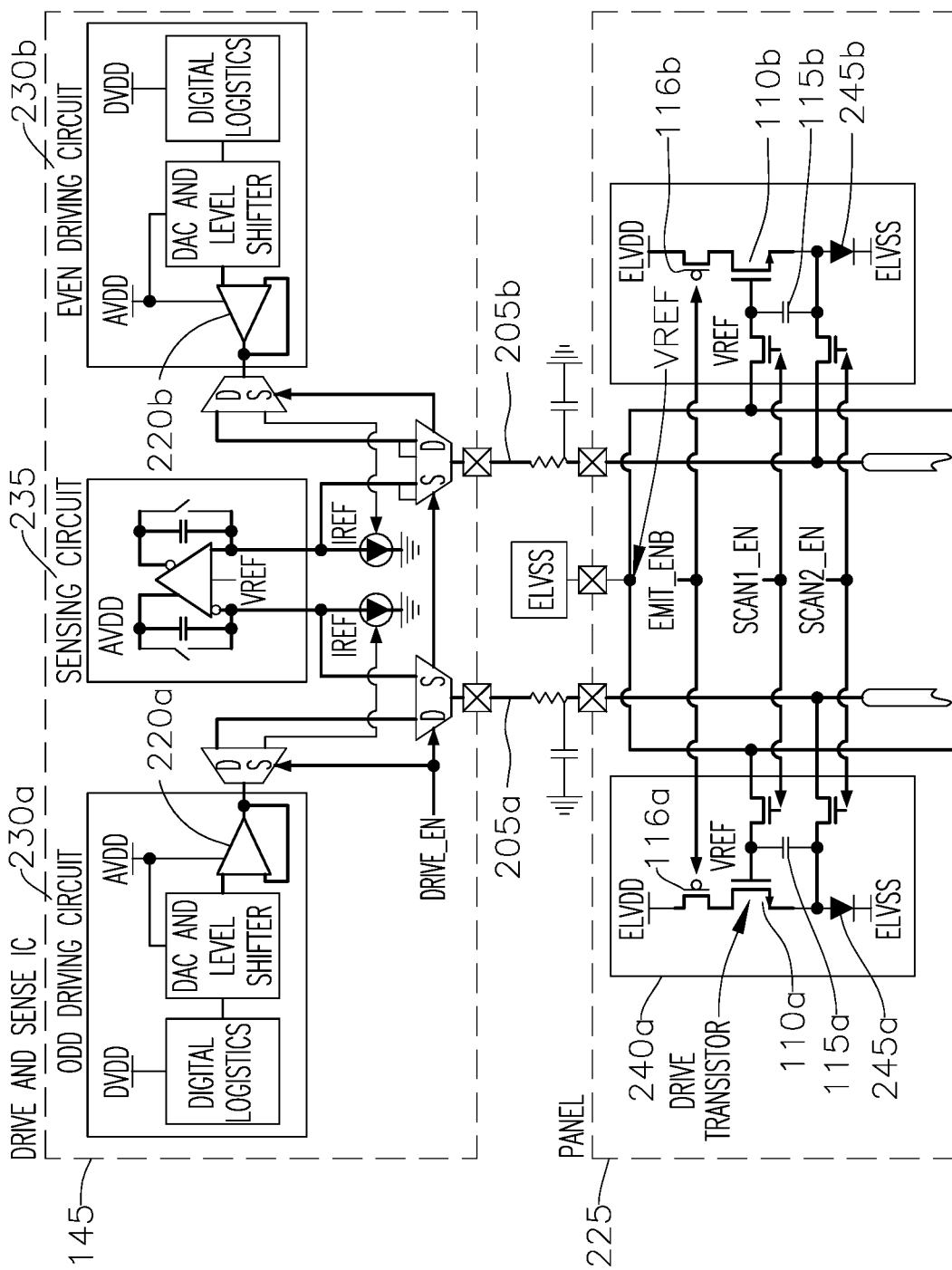

FIGS. 2A-2C are schematic diagrams of a display panel and a drive and sense integrated circuit, according to an embodiment of the present disclosure. As illustrated, a pixel drive and sense circuit 145 is connected to a panel 225 via column conductors 205a and 205b. The pixel drive and sense circuit 145 may include an odd driving circuit 230a on the left of FIGS. 2A-2C, an even driving circuit 230b on the right of FIGS. 2A-2C, and a sensing circuit 235. The panel 225 may include an odd pixel circuit 240a on the left of FIG. 2A and an even pixel circuit 240b on the right of FIGS. 2A-2C, where each pixel circuit 240a includes a respective emit transistor 116a, 116b, and drive transistor 110a, 110b that, when turned on, causes current to flow from drain voltage ELVDD to source voltage ELVSS and turns on a light emitting element (e.g., OLED) 245a, 245b.

Referring to FIG. 2A, in some embodiments, the current of any pixel may be sensed in a differential manner, for improved accuracy. For example, if the current driven by the drive transistor 110a of the odd pixel 240a is to be sensed, the drive transistor 110a may be turned on (by charging capacitor 115a of the odd pixel so as to turn on the drive transistor 110a of the odd pixel), and the drive transistor 110b of the even pixel 240b may be turned off (by discharging the capacitor 115b of the even pixel so as to turn off the drive transistor 110b of the even pixel) and the difference between the two corresponding currents flowing out of two respective column conductors 205a, 205b, may be measured. Each of the column conductors 205a, 205b may be connected to all of the pixels of a column of the display; as a result, even if all of the pixels, other than the odd pixel being characterized, are turned off, the total leakage current in the other pixels may be significant. To the extent that the leakage currents in the adjacent column (containing the even pixel) are the same, the contribution of the leakage currents to the current flowing in the column conductor connected to the odd pixel may be canceled when the difference between the currents in the two column conductors 205a, 205b is sensed.

The SCAN1, SCAN2, and EMIT control lines may be per row, and may have different timing between rows. As mentioned above, differential sensing may be used, so that half the pixels in a row are sensed per operation. The same set of gate control signals may be applied to odd and even pixels, such that there is no distinction between odd and even pixels. Each digital to analog converter and associated drive amplifier 220a, 220b may be used both to drive a corresponding column conductor 205a, 205b to charge the corresponding capacitor 115a, 115b of a pixel, and to generate the reference current when the current driven by the corresponding drive transistor 110a, 110b is being sensed; this may be accomplished using multiplexers, as shown. The embodiment of FIG. 1 does not include this feature and instead includes two separate digital to analog converters.

Referring to FIG. 2B, in some embodiments, when the circuit is in drive mode, the gate of the drive transistor 110a, 110b of each pixel is at source voltage of the pixel circuit ELVSS, and the source of the drive transistor 110a, 110b of each pixel is driven to ELVSS–VDRIVE, where VDRIVE is the driving voltage of driving transistors 110a, 110b, so that VGS=ELVSS–(ELVSS–VDRIVE)=VDRIVE, where VGS is the gate-source voltage of the driving transistor 110a, 110b.

The emit transistor 116a, 116b of each pixel may remain turned off.

In this process, a respective VDRIVE may be stored across the pixel capacitor of each the pixels.

Referring to FIG. 2C, in some embodiments, when the circuit is in sense mode, the upper pass-gate transistors 125 (FIG. 1) are turned off so that the gates of the drive transistors 110 float, and so that the charge on the capacitor of each pixel remains constant. The source of the drive transistor 110a, 110b of each pixel is driven (e.g., to VREF, which may be slightly less than ELVSS) so that each light emitting diode 120 is reverse-biased, and so that no current flows through the light emitting diodes 120. The emit transistor of each pixel is turned on, and as a result of the light emitting diode 120 being reverse-biased, any current driven by the drive transistor 110 of a pixel flows through a respective column conductor 205 to the sensing circuit. In this mode, the digital to analog converter and the drive amplifier 220 connected to it may generate the reference current IREF. In some embodiments the reference current is generated by controlling the digital to analog converter and the drive amplifier 220 to produce a voltage ramp, which is applied to a capacitor to provide a current according to the following equation:

$$IREF = C\, dV/dt$$

In operation, the sensing circuit 235 may be reset prior to the sense operation. Each sense operation may be preceded by a drive operation during which the drive amplifier 220 (FIGS. 2A-2C) drives the column conductor 205 to a set voltage. Before a sense operation starts, the voltage on the column conductor 205a, 205b may be restored to VREF. Another issue of concern with the circuit of FIG. 2C may be that because the capacitance to ground of the column conductor 205a, 205b may be large, the sense amplifier (in reset mode) may require a long time to bring the voltage of the column conductor 205a, 205b to VREF.

Figure 3:
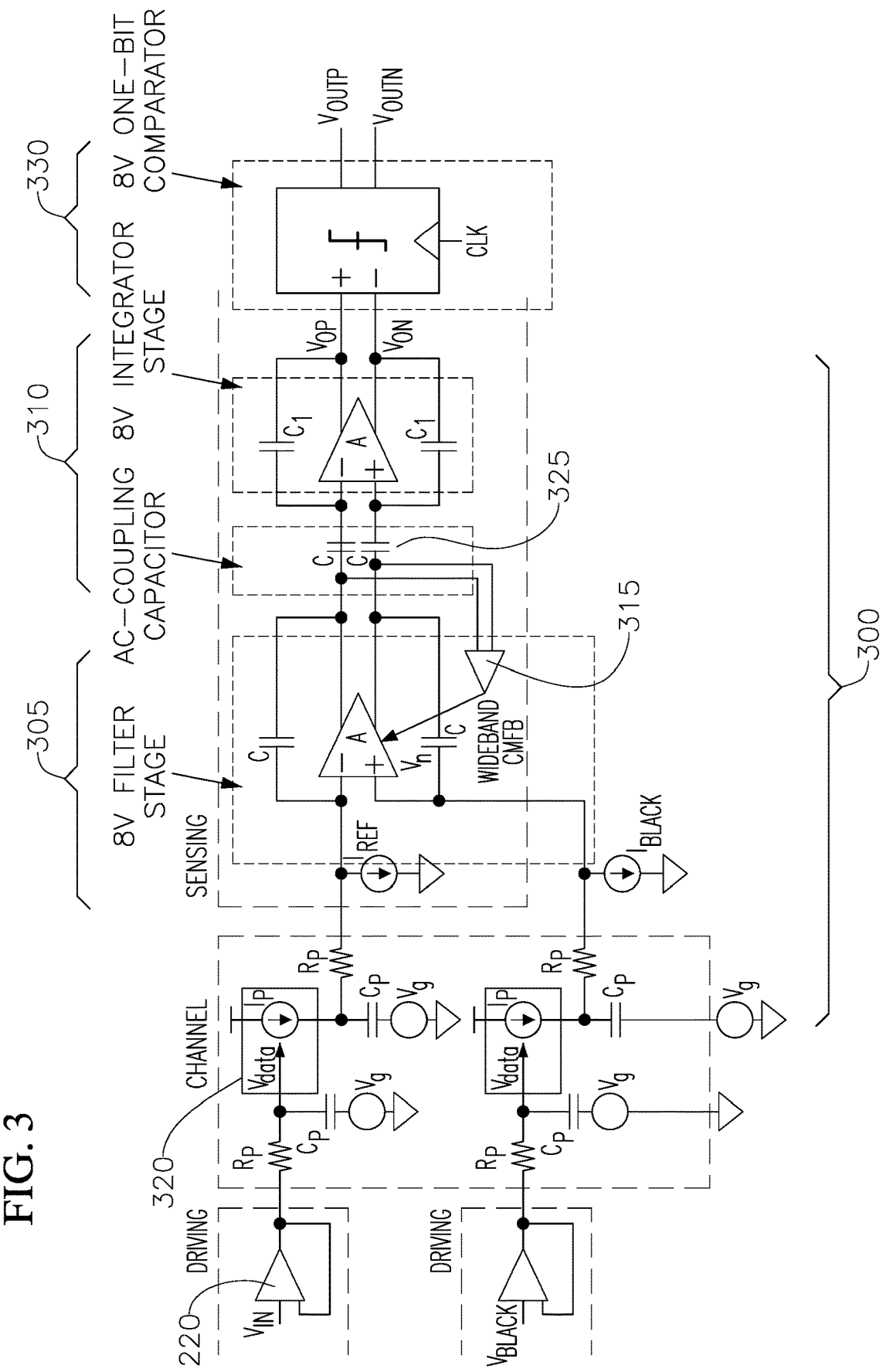
FIG. 3 is a schematic diagram of a two-stage sensing front-end circuit, according to an embodiment of the present disclosure.

FIG. 3 is a schematic of a two-stage differential sensing front-end circuit 300, with two inputs for sensing a difference between a current from a first pixel ($I_{black}$) (e.g., the odd pixel of FIGS. 2A-2C) and a current from a second pixel ($I_{Ref}$) (e.g., the even pixel of FIGS. 2A-2C) (each current having subtracted from it a respective reference current). The differential sensing circuit has a two-stage architecture with a low-pass current filter 305 (or "differential low-pass filter" 305) as the first stage, and an integrator 310 (or "differential integrator" 310) as the second stage. The output of the integrator 310 may be coupled to a comparator 330 that generates an output that is based on a comparison of the input voltages to the comparator 330. The input voltages to the comparator may be coupled to a first output $V_{OP}$ of the differential integrator and a second output $V_{ON}$ of the differential integrator. For example, the comparator 330 may be a one-bit comparator that receives an input from the first output $V_{OP}$ of the differential integrator, another input from the second output $V_{ON}$ of the differential integrator, and a clock signal. Accordingly, the comparator 330 may generate a logic 0 or a logic 1 as the output based on whether the first output $V_{OP}$ is greater than or less than the second output $V_{ON}$, which indicates the polarity of the integrator's differential output (e.g., $V_{OP}-V_{ON}$).

The integrator 310 may be coupled to the low-pass current filter 305 by a pair of AC coupling capacitors 325. Each of the differential low-pass filter 305 and the differential integrator 310 may include a fully differential operational amplifier with a capacitor (or "feedback capacitor" in each feedback path. As provided above, the circuit may be used to perform differential sensing between two adjacent pixels (e.g. a red pixel and a green pixel (of a composite pixel containing three pixels, a red pixel, a green pixel, and a blue pixel), or a green pixel and a blue pixel of a composite pixel). In some embodiments, a wideband common mode feedback amplifier 315 (which may have an open loop bandwidth of between 10 MHz and 100 MHz) feeds back around the differential low-pass filter 305.

For ease of illustration, the circuit of FIG. 3 shows both the drive amplifier 220 and the differential sensing circuit 300 simultaneously connected to the pixels 320 of a channel through respective resistor-capacitor networks used to model the column conductors 205a, 205b. In some embodiments, however, there is only one column conductor 205a or 205b per pixel, and either the drive amplifier 220 or the differential sensing circuit 300 is connected to it at any time (as shown in FIGS. 2A-2C, in which multiplexers are used to select whether the drive amplifier 220 or the differential sensing circuit is connected to the column conductor 205 at any time).

In some embodiments, the differential low-pass filter 305 and the differential integrator 310 may be fully differential. As used herein, a fully differential circuit is one that (unlike a single-ended or pseudo-differential amplifier) does not compare the signal to a fixed reference voltage. Instead, each differential gain stage in a fully differential amplifier, for example, compares the two signals being processed directly to each other.

The wideband common mode feedback amplifier 315 may compute the common mode output signal at the output of the differential low-pass filter 305 (e.g., it may compute the average of the voltages at the two output conductors using a resistor network), and feed back to a common mode input in the differential low-pass filter 305. The common mode input may be, for example, (i) a gate of a current source (or "tail current source") connected to the two sources of a differential pair in the differential low-pass filter 305, or (ii) a node connected to two corresponding transistors in the load network of a differential pair in the differential low-pass filter 305.

As illustrated, the two-stage sensing front-end circuit of FIG. 3 is configured to operate in single voltage domain, for example, an 8 V domain that is supplied by a high voltage power supply. For purposes of this disclosure, and by way of example, 8 V will be referred to as a "high voltage" or and 1 V will be referred to as a "low voltage." However, a "high voltage" and a "low voltage" are not limited to just 8 V and 1 V, respectively. Consequently, because the entire circuit is in the high voltage domain, the circuital elements are fabricated according to specifications and dimensions commensurate for this voltage (and current). For example, the first stage circuit that includes the differential low-pass filter 305 operating at 8 V utilizes 26 μA and occupies an area of 330×50 μm$^2$, and a second stage circuit including the differential integrator 310 operating at 8 V utilizes 26 μA and occupies an area of 330×50 μm$^2$, and the comparator 330 operating at 8 V utilizes 0.8 μA and occupies an area of 276×50 μm$^2$. Because a display panel is composed of hundreds or thousands of columns of pixels, hundreds or thousands of these two-stage sensing front-end circuits such as those illustrated in FIG. 3 are utilized and therefore occupy a substantial area on the silicon which in turn, take up a relatively large amount of space within a display device that uses these circuits. Furthermore, an 8 V circuit has substantial power requirements, thus contributing to a relatively larger power consumption by these display devices. Accordingly, embodiments of the present disclosure contemplate circuits that occupy less silicon area and therefore uses less power than the above described conventional sensing front-end circuits.

According to embodiments of the present disclosure, a two-stage sensing front-end circuit is described that includes a first stage (e.g., a filtering stage) that operates in a first (higher) voltage domain and a second stage (e.g., an integrator stage) that operates in a second (lower) voltage domain. Consequently, the circuital elements of the second stage may be smaller, thus occupying less area and consume less power relative to a similar stage such as in the two-stage sensing front-end circuit provided above in FIG. 3. Accordingly, a display device that includes many hundreds or thousands of the two-stage sensing front-end circuits that utilize two different voltage domains according to the embodiments of the present disclosure may consume less power and/or may be smaller in size as compared to a display device that utilizes a sensing front-end circuit that relies on a single high voltage domain.

Figure 4:
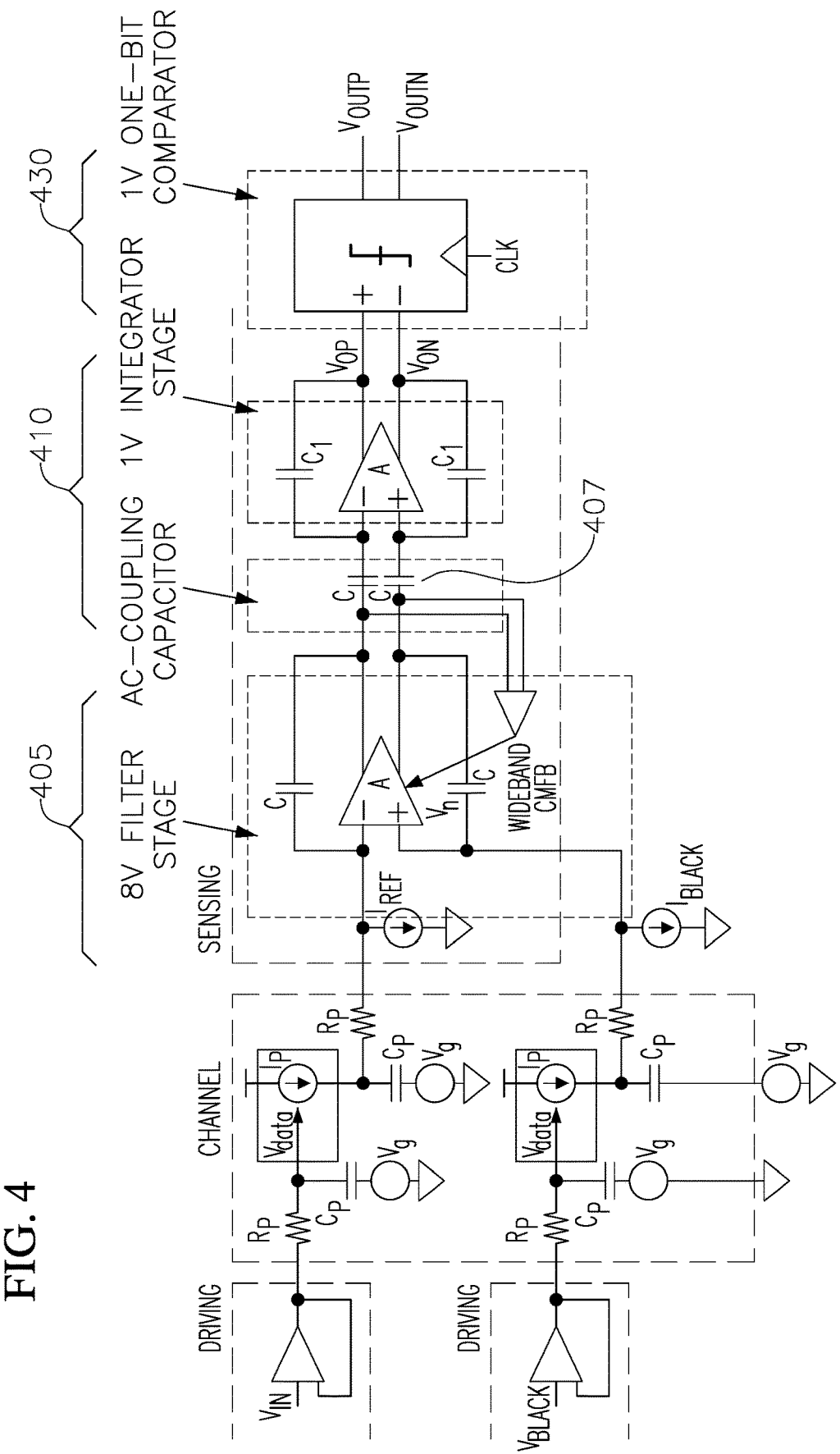
FIG. 4 is a schematic diagram of another two-stage sensing front-end circuit, according to an embodiment of the present disclosure.

FIG. 4 illustrates a two-stage sensing front-end circuit according to various embodiments of the present disclosure. For example, the first stage including the differential low-pass filter 405 may be configured to operate in a first voltage domain and the second stage including the differential integrator 410 and the comparator 430 may be configured to operate in a second voltage domain. According to one example, the first voltage domain may be an 8 V voltage domain (referred to herein as a "high voltage" domain) and the second voltage domain may be a 1 V voltage domain (referred to herein as a "low voltage" domain). While 8 V and 1 V are used to describe the various features of the embodiments to represent a "high voltage" and a "low voltage," respectively, in the present disclosure, a person having ordinary skill in the art would understand that other voltages may be utilized. For example, in other embodiments, a "high voltage" may be a voltage (e.g., 5 V, 6.5 V, 10 V, etc.) that is relatively higher than a lower "low voltage" (e.g., 0.5 V, 2 V, 2.5 V). Thus, the circuital elements that are in the low voltage domain may be fabricated to use less silicon area (and therefore take up less space on the circuit board and the display device) compared to the circuital elements that are in the high voltage domain. For example, the first stage circuits including the differential low-pass filter 405 operating at 8 V utilizes 26 μA and occupies an area of 330×50 μm$^2$, but the second stage circuit including the differential integrator 410 operating at 1 V utilizes 9 μA and occupies an area of 40×50 μm$^2$, and the comparator 430 operating at 1 V utilizes 1.3 μA and occupies an area of 106×50 μm$^2$.

The differential low-pass filter 405 may be coupled by a pair of AC coupling capacitors 407 which isolates the first voltage domain from the second voltage domain between the differential low-pass filter 405 and the differential integrator 410. More particularly, the AC coupling capacitors 407 electrically isolate the DC voltages of the first voltage domain (e.g., 8 VDC) and the DC voltage of the second voltage domain (e.g., 1 VDC) while still electrically coupling AC signals from the differential low-pass filter 405 to the differential integrator 410. Accordingly, the sensing front-end circuit as illustrated in FIG. 4 may be fabricated such that the elements to the left (as oriented in FIG. 4) of the pair of AC coupling capacitors operate in the high voltage domain and all elements to the right (as oriented in FIG. 4) of the pair of AC coupling capacitors operate in the low voltage domain, thus reducing the size of the circuit elements that are in the second voltage domain.

Figure 5:
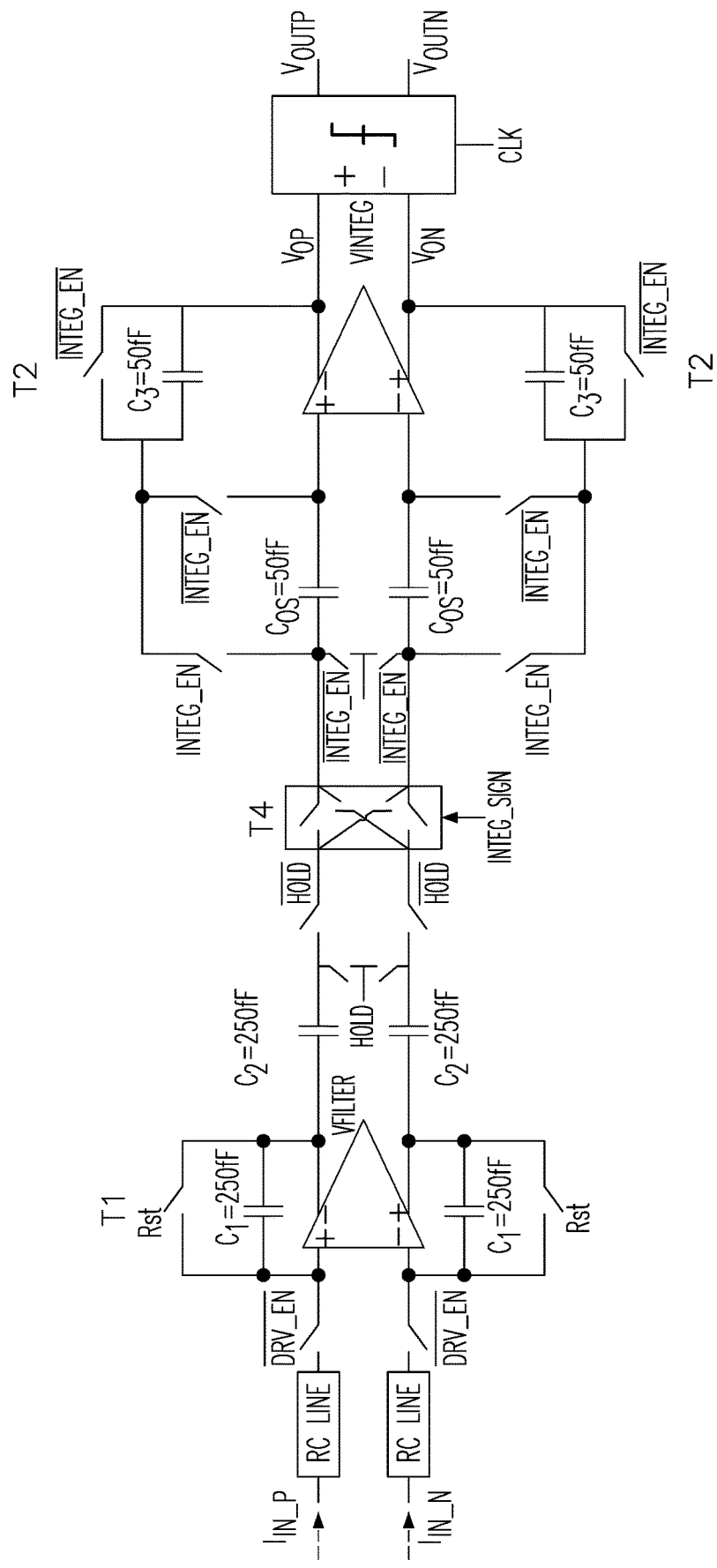
FIG. 5 is a more detailed schematic diagram of a two-stage sensing front-end circuit, according to an embodiment of the present disclosure.
Figure 6:
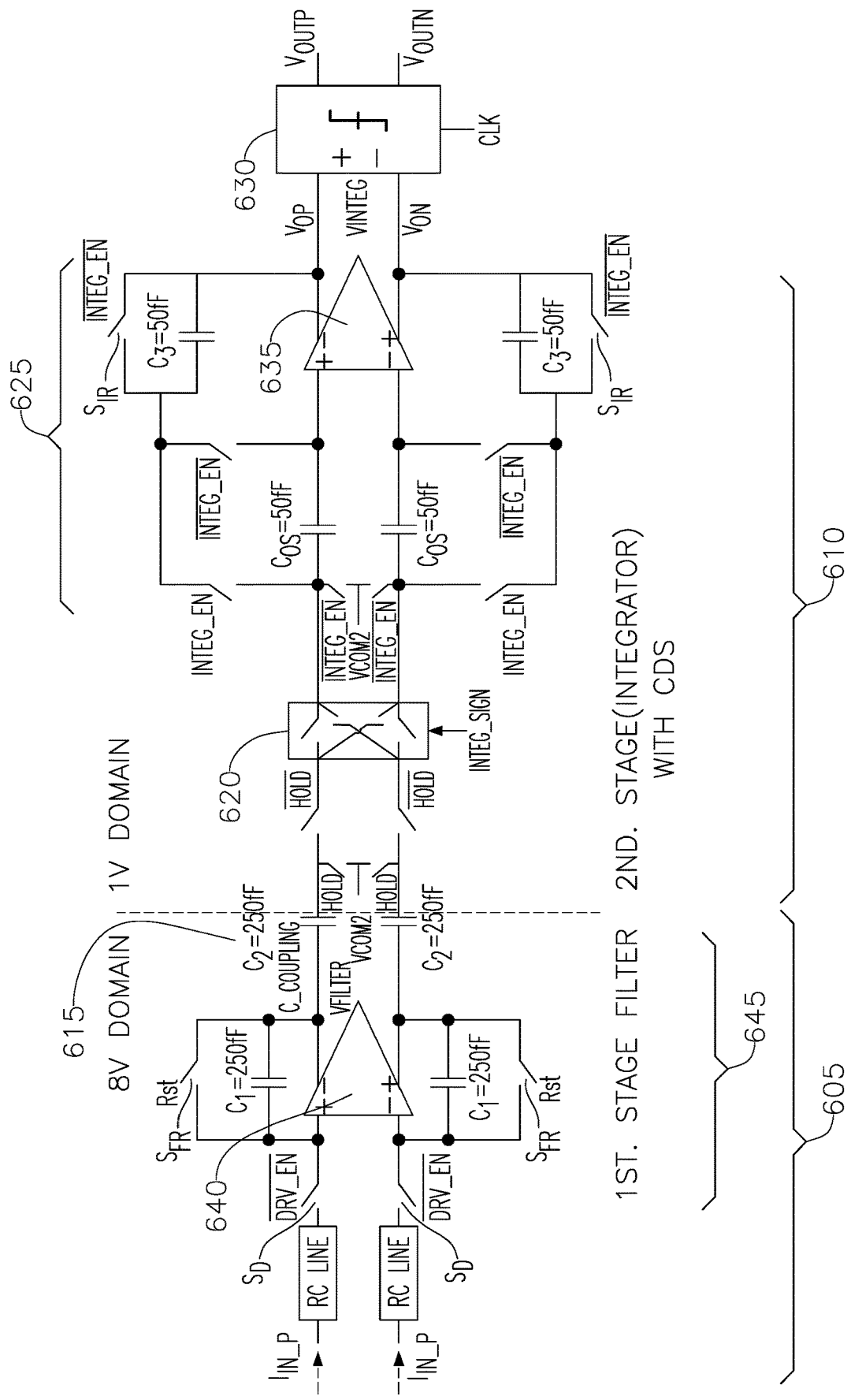
FIG. 6 is a more detailed schematic diagram of another two-stage sensing front-end circuit, according to an embodiment of the present disclosure.

FIGS. 5-6 illustrate an embodiment of the two-stage sensing front-end circuit in more detail. FIG. 5 depicts the circuit according to a single voltage domain implementation similar to that illustrated in FIG. 3 where a single high voltage (e.g., 8 V) domain is utilized to supply power to the entire circuit. FIG. 6 depicts a two-voltage domain circuit that is similar to that illustrated in FIG. 5 except the first stage is implemented in the high voltage domain (e.g., 8 V) and the second state is implemented in the low voltage domain (e.g., 1 V).

According to the embodiment illustrated in FIG. 6, the two-stage sensing front-end circuit includes a first stage 605 (e.g., low-pass filtering stage) and a second stage 610 (e.g., an integrator stage) coupled by a pair of AC coupling capacitors 615. The first stage 605 includes a differential low-pass filter 645 comprised of a differential amplifier 640 that has a differential input and a differential output. The differential amplifier 640 may be an op amp that is configured to operate in the high voltage domain (e.g., 8 V). In some embodiments, the differential amplifier 640 includes a pair of feedback capacitors $C_1$ and a pair of filter reset switches $S_{FR}$ coupled in parallel with each other from the output of the differential amplifier 640 to the input of the differential amplifier 640. Thus, when a filter reset control signal Rst is applied to the filter reset switches $S_{FR}$, the filter reset switches $S_{FR}$ may close and the low-pass differential filter 645 may be reset. In some embodiments, the first stage 605 includes switches $S_D$ that are configured to enable or disable the differential input to the first stage 605. For example, a Drv_en signal may be applied to the switches $S_D$ to close the switches $S_D$ to enable the different input or open the switches $S_D$ to disable the differential input. Because the first stage 605 operates in the high voltage domain, the filter reset control signal Rst and the Drv_en signal are also provided in the high voltage domain (e.g., 8 V).

The second stage 610 includes a differential integrator 625, a polarity-reversing switch 620, and a comparator 630. In some embodiments, the differential integrator 625 is also comprised of a differential amplifier 635 that has a differential input and a differential output $V_{OP}$, $V_{ON}$, and the differential amplifier 635 may be an op amp. According to an embodiment of the present disclosure, the differential integrator 625 is configured to operate in the low voltage domain (e.g., 1 V), which is a voltage level that is substantially lower than the high voltage. The differential input of the differential integrator 625 may be coupled to the output of the differential low-pass filter 645 in the first stage 605 via the pair of AC coupling capacitors 615 and the polarity-reversing switches 620. For example, the output of the differential low-pass filter 645 may be coupled to the pair of AC coupling capacitors 615, and the pair of AC coupling capacitors 615 may be coupled to the polarity-reversing switches 620. The polarity-reversing switches 620 may then be coupled to the differential inputs of the differential integrator 625.

In some embodiments, a pair of integrator feedback capacitors $C_3$ and a pair of integrator reset switches $S_{IR}$ may be coupled in parallel with each other from the differential output $V_{OP}$, $V_{ON}$ of the differential integrator 625 to the differential input of the differential integrator 625. Thus, when an integrator reset control signal Integ_en is applied to the integrator reset switches $S_{IR}$, the integrator reset switches $S_{IR}$ may close and the differential integrator 625 may be reset. Because the second stage 610 operates in the low voltage domain, the integrator reset control signal Integ_en is also provided in the low voltage domain (e.g., 1 V).

In some embodiments, the polarity-reversing switch 620 may be a correlated double sampling (CDS) circuit. For example, the method may include a first phase, in which the signal (i.e., the current to be sensed) is turned off and noise is accumulated (e.g., integrated), and a second phase, in which the signal is turned on and the combination of the signal and the noise are accumulated (e.g., integrated); the two integrated results may then be subtracted. In the case of pixel current sensing, the first phase may involve integrating the input current when the pixel is turned off (i.e., integrating the noise) and the second phase may involve integrating the input current when the pixel is turned on.

The polarity-reversing switch 620 may for example include a first pair of switches that, when turned on (e.g., closed), connect (i) the upper capacitor of the pair of AC coupling capacitors 615 to the upper input of the differential integrator 625 and (ii) the lower capacitor of the pair of AC coupling capacitors 615 to the lower input of the differential integrator 625. The polarity-reversing switch 620 may further include a second pair of switches that, when turned on (e.g., closed), connect (i) the upper capacitor of the pair of AC coupling capacitors 615 to the lower input of the differential integrator 625 and (ii) the lower capacitor of the pair of AC coupling capacitors 615 to the upper input of the differential integrator 625. As such, when the first pair of switches is turned on and the second pair of switches is turned off, the polarity of the connection between the differential low-pass filter 645 and the differential integrator 625 are the opposite of the polarity of the connection between the differential low-pass filter 645 and the differential integrator 625 when the first pair of switches is turned off and the second pair of switches is turned on.

In some embodiments, the comparator 630 may be a one-bit comparator that has two inputs $V_{OP}$, $V_{ON}$, two outputs $V_{OUTP}$, $V_{OUTN}$, and a clock signal input clk. The inputs of the comparator 630 may be coupled to the differential output $V_{OP}$, $V_{ON}$ of the differential integrator 625 and the outputs $V_{OUTP}$, $V_{OUTN}$ of the comparator 630 may be coupled to an external circuit such as an FPGA, not shown. Accordingly, the comparator 630 determines whether the polarity of the input voltage $V_{OP}$ is positive or negative based on the digital output from the comparator.

According to the embodiment, the comparator 630 also operates in the low voltage domain, and therefore the clock signal clk input to the comparator 630 is also provided in the low voltage domain (e.g., 1 V). Therefore, as explained above, all control signals and clock signals (e.g., Integ_sign, Integ_en, clk) and their complementary signals in the second stage, as well as the supply voltages for the polarity-reversing switches 620, differential integrator 625, and the comparator 630 are a low voltage and operate in the low voltage domain (e.g., 1 V), while the control signals for the first stage (e.g., Rst, Drv_en) and their complementary signals operate in the high voltage domain (e.g., 8 V). By moving all of the elements that are to the right of the pair of AC coupling capacitors 615 in FIG. 6 (e.g., all elements in the second stage and the comparator) to the low voltage domain while keeping the elements to the left of the pair of AC coupling capacitors 615 in FIG. 6 (e.g., the elements in the first stage) in the high voltage domain, the coupled current from the first stage to the second stage (i.e., through the pair of AC coupling capacitors 615) may be reduced. According to the embodiment, the coupled current is proportional to C_coupling*dV/dt, where C_coupling is the capacitance of the AC coupling capacitors 615, and dV/dt is the rate of swing of the control signal. Thus, power consumed by transmitting control signals to the two-stage sensing front-end circuit of FIG. 6 may be less than power that would be consumed by transmitting control signals (e.g., all within the 8 V domain) to the sensing front-end of FIG. 5.

FIG. 7 illustrates a comparison of current consumption and dimensions of an example two-stage sensing front-end circuit that uses the single voltage domain design where the entire circuit operates at 8 V ("HV design") and a two-voltage domain design where the first stage operates at 8 V and the second stage operates at a lower 1 V ("HV-LV design"). As can be seen, power consumption and the amount of space taken up by the circuit in the HV-LV design is substantially less than the HV design. In some embodiments, the topology of the op-amp of the differential low-pass filter may be changed so that even the first stage circuit that operates in the high voltage domain utilizes less silicon area, for example, 170×50 $\mu m^2$.

The high voltage and the low voltage that are used by the two-stage sensing front-end circuit according to the embodiments of the present disclosure may be provided from an external power supply, that is not a part of the sensing front-end circuitry. Thus, the sensing front-end circuit is able to operate in two different voltage domains without the additional cost of implementing power supply or power conversion circuits directly on the sensing circuits. Consequently, the circuital elements in the second stage that operate in the low voltage domain may be fabricated using smaller dimensions, thus conserving the amount of space that it takes up, and saving space in the display device that utilizes a plurality of these sensing front-end circuits.

An input of a circuit includes a conductor connected to each input. For example, a circuit such as a differential op amp having two inputs would have a conductor connected to each of the two inputs. In some embodiments, the circuit may include further inputs, in which case a conductor may be connected to each of the further inputs. Thus, as used herein, an "input" of a circuit refers to one or more conductors connected to one or more inputs. For example, a differential input may include a first conductor identified as a noninverting input and a second conductor identified as an inverting input. Similarly, an output of a circuit includes a conductor connect to each output. Thus, a circuit may include a plurality of outputs and each output may be connected to a conductor. Thus, an "output" of a circuit, as used herein, refers to one or more conductors connected to one or more outputs. For example, a differential output may include a first conductor identified as a noninverting output and a second conductor identified as an inverting output. As used herein, a "switch" may refer to a single switch or a plurality of switches forming a switch. That is, one or more switches referred to herein and depicted in the figures as a single switch may include a plurality of switches For example, a single-pole, double-throw (SPDT) switch may be implemented as two single-pole, single-throw (SPST) switches (e.g., each SPST switch being a transistor) controlled such that at all times in operation one of the SPST switches is open and one of the SPST switches is closed. Similarly, a polarity-reversing switch may be constructed using four SPST switches (e.g., four transistors) as discussed in further detail above. As used herein, when a first component is described as being "selectively connected" to a second component, the first component is connected to the second component by a switch (e.g., a transistor switch), so that, depending on the state of the switch, the first component may be connected to the second component or disconnected from the second component.

In some embodiments, the control of various control signals and of circuits like the digital to analog converter may be performed by a processing circuit. The term "processing circuit" is used herein to mean any combination of hardware, firmware, and software, employed to process data or digital signals. Processing circuit hardware may include, for example, application specific integrated circuits (ASICs), general purpose or special purpose central processing units (CPUs), digital signal processors (DSPs), graphics processing units (GPUs), and programmable logic devices such as field programmable gate arrays (FPGAs). In a processing circuit, as used herein, each function is performed either by hardware configured, i.e., hard-wired, to perform that function, or by more general purpose hardware, such as a CPU, configured to execute instructions stored in a non-transitory storage medium. A processing circuit may be fabricated on a single printed circuit board (PCB) or distributed over several interconnected PCBs. A processing circuit may contain other processing circuits; for example a processing circuit may include two processing circuits, an FPGA and a CPU, interconnected on a PCB.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed herein could be termed a second element, component, region, layer or section, without departing from the spirit and scope of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that such spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the terms "substantially," "about," and similar terms are used as terms of approximation and not as terms of degree, and are intended to account for the inherent deviations in measured or calculated values that would be recognized by those of ordinary skill in the art. As used herein, the term "major portion", when applied to a plurality of items, means at least half of the items.

As used herein, the singular forms "a" and "an" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. Further, the use of "may" when describing embodiments of the inventive concept refers to "one or more embodiments of the present disclosure". Also, the term "exemplary" is intended to refer to an example or illustration. As used herein, the terms "use," "using," and "used" may be considered synonymous with the terms "utilize," "utilizing," and "utilized," respectively.

It will be understood that when an element or layer is referred to as being "on", "connected to", "coupled to", or "adjacent to" another element or layer, it may be directly on, connected to, coupled to, or adjacent to the other element or layer, or one or more intervening elements or layers may be present. In contrast, when an element or layer is referred to as being "directly on", "directly connected to", "directly coupled to", or "immediately adjacent to" another element or layer, there are no intervening elements or layers present.

Any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein.

Although exemplary embodiments of a correlated double sampling pixel sensing front end have been specifically described and illustrated herein, many modifications and variations will be apparent to those skilled in the art. Accordingly, it is to be understood that a correlated double sampling pixel sensing front end constructed according to principles of this disclosure may be embodied other than as specifically described herein. The invention is also defined in the following claims, and equivalents thereof.

What is claimed is:

1. A circuital system comprising:
   a differential low-pass filter comprising a differential output and operable in a first voltage domain;
   a differential integrator comprising a differential input and a differential output, and operable in a second voltage domain different from the first voltage domain; and
   a pair of AC coupling capacitors coupling the differential output of the differential low-pass filter to the differential input of the differential integrator.

2. The system of claim 1, wherein the pair of AC coupling capacitors are configured to electrically isolate the first voltage domain from the second voltage domain.

3. The system of claim 1, wherein the first voltage domain is supplied by a first voltage from an external power supply and the second voltage domain is supplied by a second voltage from the external power supply.

4. The system of claim 3, wherein the second voltage is a lower voltage than the first voltage.

5. The system of claim 4, further comprising a polarity-reversing switch coupled between the pair of AC coupling capacitors and the differential input of the differential integrator, wherein the polarity-reversing switch is configured to receive a polarity-reversing control signal operable in the second voltage domain.

6. The system of claim 5, wherein the polarity-reversing switch is configured to reverse a polarity of the differential input to the differential integrator responsive to receiving the polarity-reversing control signal.

7. The system of claim 6, wherein the polarity-reversing switch is a correlated double sampling (CDS) circuit comprising:
   a pair of first switches configured to couple a first electrode of the differential low-pass filter output to a first electrode of the differential integrator input, and couple a second electrode of the differential low-pass filter output to a second electrode of the differential integrator input, responsive to a first polarity-reversing control signal; and
   a pair of second switches configured to couple the first electrode of the differential low-pass filter output to the second electrode of the differential integrator input, and couple the second electrode of the differential low-pass filter output to the first electrode of the differential integrator input, responsive to a second polarity-reversing control signal.

8. The system of claim 4, wherein the differential integrator further comprises a pair of integrator reset switches configured to reset the differential integrator responsive to an integrator reset control signal, wherein the pair of integrator reset switches are operable in the second voltage domain.

9. The system of claim 8, wherein the differential low-pass filter further comprises a pair of filter reset switches configured to reset the differential low-pass filter responsive to receiving a filter reset control signal, wherein the pair of filter reset switches are operable in the first voltage domain.

10. The system of claim 4, further comprising a comparator comprising a differential input coupled to the differential output of the differential integrator, and operable in the second voltage domain.

11. The system of claim 10, wherein the comparator is coupled to receive a clock signal, wherein the clock signal is operable in the second voltage domain.

12. A sensing circuit comprising:
   a low-pass filtering stage operable in a first voltage domain, the low-pass filtering stage comprising:
      a first differential amplifier comprising a differential input and a differential output;
      a first feedback capacitor coupling a first output electrode of the differential output of the first differential amplifier to a first input electrode of the differential input of the first differential amplifier; and
      a second feedback capacitor coupling a second output electrode of the differential output of the first differential amplifier to a second input electrode of the differential input of the first differential amplifier;
   an integrator stage operable in a second voltage domain, the integrator stage comprising:
      a second differential amplifier comprising a differential input and a differential output;
      a third feedback capacitor coupling a first output electrode of the differential output of the of the second differential amplifier to a first input electrode of the differential input of the second differential amplifier; and
      a fourth feedback capacitor coupling a second output electrode of the differential output of the second differential amplifier to a second input electrode of the differential input of the second differential amplifier; and a pair of AC-coupling capacitors coupling the differential output of the first differential amplifier to the differential input of the second differential amplifier, and configured to electrically isolate the first voltage domain from the second voltage domain.

13. The circuit of claim 12, wherein the first voltage domain is supplied by a first voltage from an external power supply and the second voltage domain is supplied by a second voltage from the external power supply, and wherein the second voltage is a lower voltage than the first voltage.

14. The circuit of claim 13, wherein the integrator stage further comprises a polarity-reversing switch coupled between the pair of AC-coupling capacitors and the differential input of the second differential amplifier, wherein the polarity-reversing switch is configured to receive a polarity-reversing control signal operable in the second voltage domain.

15. The circuit of claim 14, wherein the polarity-reversing switch is a correlated double sampling (CDS) circuit, and the CDS is configured to reverse a polarity of the differential input to the second differential amplifier responsive to receiving the polarity-reversing control signal.

16. The circuit of claim 15, wherein the integrator stage further comprises:

a first integrator reset switch connected across the third feedback capacitor;

a second integrator reset switch connected across the fourth feedback capacitor; and wherein the first integrator reset switch and the second integrator reset switch are operable in the second voltage domain and configured to reset a respective differential output of the second differential amplifier responsive to receiving a respective integrator reset control signal.

17. The circuit of claim 16, wherein the low-pass filtering stage further comprises:

a first filter reset switch connected across the first feedback capacitor;

a second filter reset switch connected across the second feedback capacitor; and wherein the first filter reset switch and the second filter reset switch are operable in the first voltage domain and configured to reset a respective differential output of the first differential amplifier responsive to receiving a respective filter reset control signal.

18. The circuit of claim 16, further comprising a comparator comprising a differential input coupled to the differential output of the second differential amplifier, and operable in the second voltage domain.

19. The circuit of claim 18, wherein the comparator is coupled to receive a clock signal operable in the second voltage domain.

20. The circuit of claim 12, wherein the second differential amplifier is a fully differential amplifier.

* * * * *